(12) United States Patent
Shah et al.

(10) Patent No.: US 7,611,319 B2
(45) Date of Patent: Nov. 3, 2009

(54) METHODS AND APPARATUS FOR IDENTIFYING SMALL LOT SIZE SUBSTRATE CARRIERS

(75) Inventors: Vinay Shah, San Francisco, CA (US); Martin R. Elliott, Round Rock, TX (US); Jeffrey C. Hudgens, San Francisco, CA (US); Eric Andrew Englhardt, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 404 days.

(21) Appl. No.: 11/154,932

(22) Filed: Jun. 16, 2005

(65) Prior Publication Data
US 2006/0182531 A1 Aug. 17, 2006

Related U.S. Application Data

(60) Provisional application No. 60/580,024, filed on Jun. 16, 2004.

(51) Int. Cl.
*B65B 69/00* (2006.01)
(52) U.S. Cl. .............. 414/411; 414/217; 414/217.1; 414/226.04; 414/684.3; 414/805; 414/935; 414/940
(58) Field of Classification Search .......... 414/217, 414/940, 226.04, 217.1, 411, 684.3, 805, 414/935; 700/215, 221
See application file for complete search history.

(56) References Cited

U.S. PATENT DOCUMENTS

| | | | | |
|---|---|---|---|---|
| 4,614,474 A | * | 9/1986 | Sudo | 414/281 |
| 5,186,594 A | | 2/1993 | Toshima et al. | |
| 5,239,437 A | * | 8/1993 | Hoge et al. | 360/132 |
| 5,388,945 A | * | 2/1995 | Garric et al. | 414/217.1 |
| 5,390,785 A | * | 2/1995 | Garric et al. | 206/213.1 |
| 5,411,358 A | * | 5/1995 | Garric et al. | 414/277 |
| 5,692,623 A | * | 12/1997 | Todor et al. | 360/94 |
| 5,769,588 A | | 6/1998 | Toshima et al. | |
| 5,867,476 A | * | 2/1999 | Yoshida et al. | 720/720 |
| 5,980,183 A | * | 11/1999 | Fosnight | 414/222.01 |
| 6,008,964 A | * | 12/1999 | Goodknight et al. | 360/92 |
| 6,152,669 A | * | 11/2000 | Morita et al. | 414/217 |

(Continued)

FOREIGN PATENT DOCUMENTS

EP 0472536 B1 12/1994

(Continued)

OTHER PUBLICATIONS

Page, et al., "Robotic Wafer Handling and Inspection in the IC Fab", Jul. 1990, Microelectronic Manufacturing and Testing, vol. 13, No. 8, pp. 27-28.

(Continued)

*Primary Examiner*—Michael S Lowe
(74) *Attorney, Agent, or Firm*—Dugan & Dugan, PC

(57) ABSTRACT

In at least one aspect, a system is provided that includes (1) a substrate carrier having first docking features; and (2) a loadport having second docking features. The second docking features are adapted to block docking of substrate carriers that do not include the first docking features and to allow docking of substrate carriers that include the first docking features. Numerous other aspects are provided.

33 Claims, 10 Drawing Sheets

U.S. PATENT DOCUMENTS

| | | | | |
|---|---|---|---|---|
| 6,176,023 | B1* | 1/2001 | Doche | 34/451 |
| 6,231,290 | B1* | 5/2001 | Kikuchi et al. | 414/221 |
| 6,431,806 | B1* | 8/2002 | Doche | 414/217 |
| 6,454,508 | B2 | 9/2002 | Toshima et al. | |
| 6,454,519 | B1 | 9/2002 | Toshima et al. | |
| 6,517,304 | B1* | 2/2003 | Matsumoto | 414/217 |
| 6,577,593 | B2* | 6/2003 | Masuoka et al. | 720/738 |
| 6,579,052 | B1* | 6/2003 | Bonora et al. | 414/222.01 |
| 6,581,264 | B2* | 6/2003 | Ohori et al. | 29/426.1 |
| 6,599,076 | B2 | 7/2003 | Toshima et al. | |
| 6,640,972 | B2* | 11/2003 | Morita | 206/387.14 |
| 6,813,144 | B2* | 11/2004 | Tango | 361/679 |
| 6,955,197 | B2 | 10/2005 | Elliott et al. | |
| 7,051,870 | B2 | 5/2006 | Schoendienst et al. | |
| 7,077,264 | B2 | 7/2006 | Rice et al. | |
| 7,097,036 | B2* | 8/2006 | Morita | 206/501 |
| 7,147,424 | B2 | 12/2006 | Weaver | |
| 7,234,584 | B2 | 6/2007 | Rice et al. | |
| 7,243,003 | B2 | 7/2007 | Rice et al. | |
| 7,258,520 | B2 | 8/2007 | Elliott et al. | |
| 7,299,831 | B2 | 11/2007 | Elliott et al. | |
| 7,467,919 | B2 | 12/2008 | Weaver | |
| 2001/0005476 | A1* | 6/2001 | Kikuchi et al. | 414/217 |
| 2003/0002960 | A1 | 1/2003 | Toshima et al. | |
| 2004/0109259 | A1* | 6/2004 | Hiraguchi et al. | 360/92 |
| 2005/0040662 | A1 | 2/2005 | Rice | |
| 2005/0232734 | A1 | 10/2005 | Elliott et al. | |
| 2006/0245854 | A1 | 11/2006 | Toshima et al. | |
| 2007/0116545 | A1 | 5/2007 | Rice et al. | |
| 2007/0140822 | A1 | 6/2007 | Elliott et al. | |

FOREIGN PATENT DOCUMENTS

| | | |
|---|---|---|
| EP | 0651429 A1 | 5/1995 |
| EP | 0556193 B1 | 12/1995 |
| EP | 0663686 B1 | 6/1997 |
| EP | 0684631 B1 | 4/1998 |
| JP | 08046005 A | 2/1996 |
| JP | 08139153 A | 5/1996 |
| JP | 10144764 A | 5/1998 |
| JP | 11121585 A | 4/1999 |
| JP | 200068350 A | 3/2000 |
| WO | WO 97/03001 A1 | 1/1997 |
| WO | WO 98/50946 A1 | 11/1998 |
| WO | WO 99/28952 A2 | 6/1999 |
| WO | WO 99/57940 A2 | 11/1999 |
| WO | WO 00/03416 A2 | 1/2000 |
| WO | WO 00/03416 A3 | 1/2000 |
| WO | WO 00/44653 A1 | 8/2000 |
| WO | WO 00/59004 A1 | 10/2000 |
| WO | WO 00/67334 A1 | 11/2000 |
| WO | WO 01/10756 A1 | 2/2001 |
| WO | WO 02/04774 A2 | 1/2002 |

OTHER PUBLICATIONS

Martin, et al., "Design Criteria for 300 mm Silicon Wafer Carriers, Material Handling Systems & Tools", 1995, Proceedings of the 41st Annual Technical Meeting of the Institute of Environmental Sciences, pp. 107-117.

Weiss, Mitchell, "Evaluating 300-mm Fab Automation Technology Options and Selection Criteria", Jun. 1997, MICRO, vol. 15, No. 6, pp. 65-66, 68, 70, 72, 74, 76, 78-79.

Kobayashi, et al., "Particle Characteristics of 300-mm Minienvironment (FOUP and LPU)", 1999, Proceedings of 1999 IEEE International Symposium on Semiconductor Manufacturing Conference Proceedings, pp. 39-42.

No-Author, "PRI Selected by Varian Semiconductor to Supply 300mm Integrated Front-End Buffering Solutions", Feb. 10, 2000, Newswire, p. 7434.

No-Author, "300mm Single-Wafer Handling" (Brief Article), Apr. 1, 2000, Solid State Technology, vol. 43, No. 4, p. 99, Dec. 7, 2007.

* cited by examiner

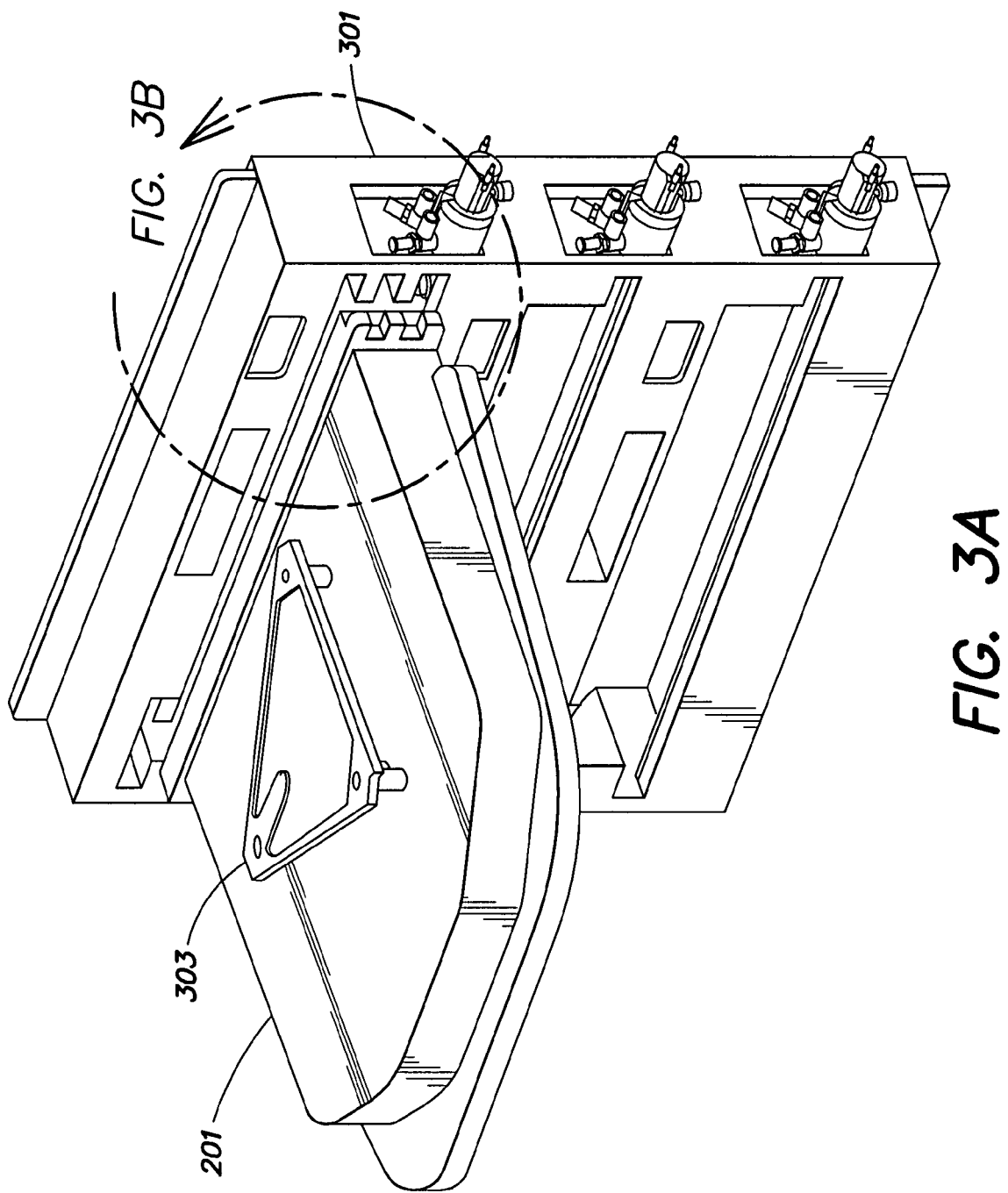

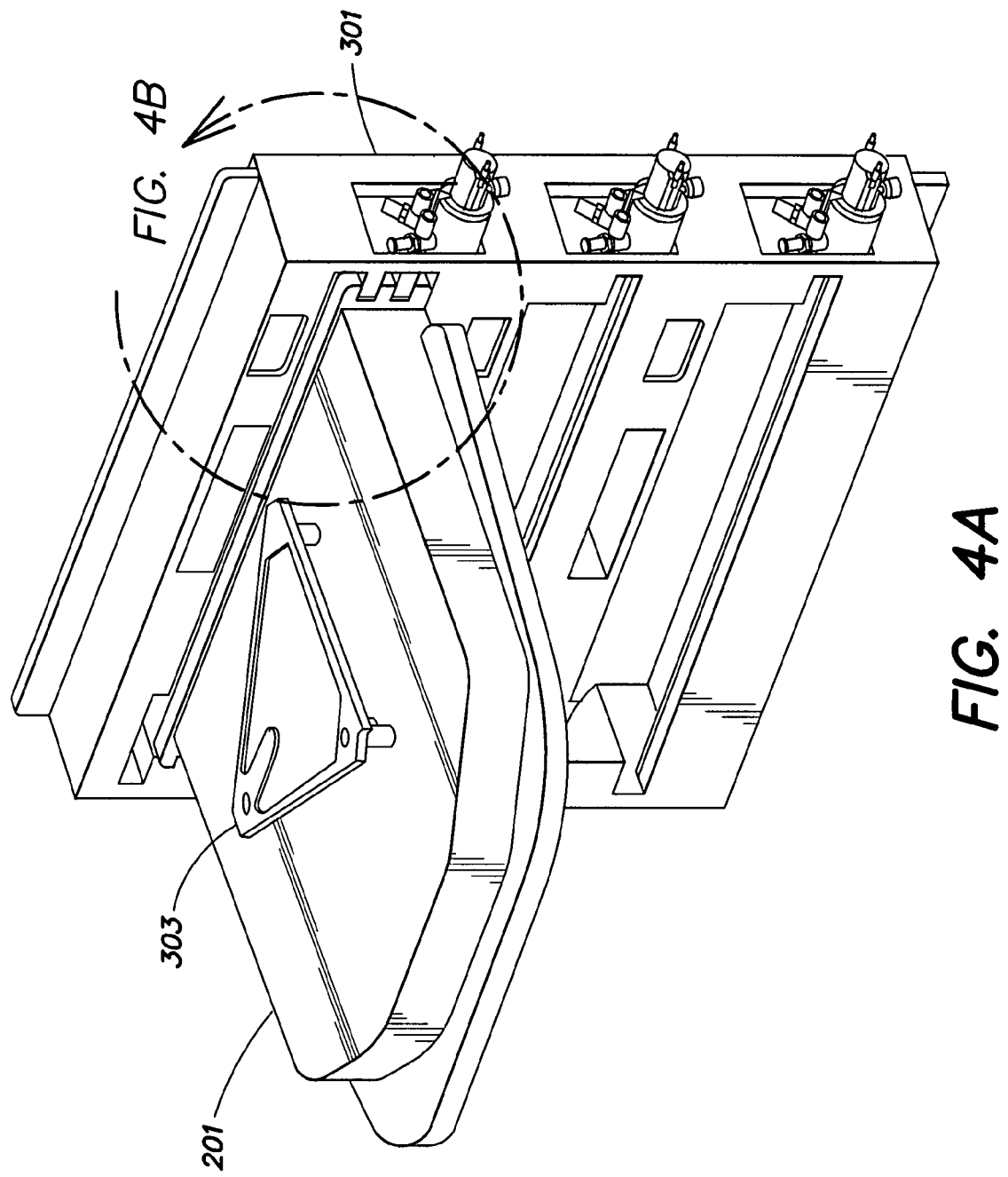

ND APPARATUS FOR
IDENTIFYING SMALL LOT SIZE
SUBSTRATE CARRIERS

The present application claims priority to U.S. Provisional Patent Application Ser. No. 60/580,024, filed Jun. 16, 2004, which is hereby incorporated by reference herein in its entirety.

CROSS REFERENCE TO RELATED APPLICATIONS

The present application is related to the following commonly-assigned, co-pending U.S. patent applications, each of which is hereby incorporated by reference herein in its entirety:

U.S. patent application Ser. No. 10/650,310, filed Aug. 28, 2003 and titled "System For Transporting Substrate Carriers";

U.S. patent application Ser. No. 10/764,982, filed Jan. 26, 2004 and titled "Methods and Apparatus for Transporting Substrate Carriers";

U.S. patent application Ser. No. 10/650,480, filed Aug. 28, 2003 and titled "Substrate Carrier Handler That Unloads Substrate Carriers Directly From a Moving Conveyor";

U.S. patent application Ser. No. 10/764,820, filed Jan. 26, 2004 and titled "OVERHEAD TRANSFER FLANGE AND SUPPORT FOR SUSPENDING A SUBSTRATE CARRIER"; and U.S. patent application Ser. No. 11/051,504, filed Feb. 4, 2005 and titled "SMALL LOT SIZE SUBSTRATE CARRIERS".

FIELD OF THE INVENTION

The present invention relates generally to semiconductor device fabrication systems, and is more particularly concerned with transportation of substrate carriers within a fabrication facility.

BACKGROUND

Manufacturing of semiconductor devices typically involves performing a sequence of procedures with respect to a substrate such as a silicon substrate, a glass plate, etc. (Such substrates may also be referred to as wafers, whether patterned or unpatterned.) These steps may include polishing, deposition, etching, photolithography, heat treatment, and so forth. Usually a number of different processing steps may be performed in a single processing system or "tool" which includes a plurality of processing chambers. However, it is generally the case that other processes are required to be performed at other processing locations within a fabrication facility, and it is accordingly necessary that substrates be transported within the fabrication facility from one processing location to another. Depending upon the type of semiconductor device to be manufactured, there may be a relatively large number of processing steps required to be performed at many different processing locations within the fabrication facility.

It is conventional to transport substrates from one processing location to another within substrate carriers such as sealed pods, cassettes, containers and so forth. To avoid cross contamination of processing locations, the location of each substrate carrier should be monitored (e.g., to ensure that substrates are not inadvertently transported to a processing location that may be contaminated by the substrates). If a substrate carrier is nonetheless delivered to the wrong processing location, it would be desirable to prevent the substrate carrier from being opened at the processing location.

SUMMARY OF THE INVENTION

In a first aspect of the invention, a system is provided that includes (1) a substrate carrier having first docking features; and (2) a loadport having second docking features. The second docking features are adapted to block docking of substrate carriers that do not include the first docking features and to allow docking of substrate carriers that include the first docking features.

In a second aspect of the invention, a substrate carrier is provided that includes first docking features. The first docking features are adapted to interact with second docking features of a load port that block docking of substrate carriers that do not include the first docking features and allow docking of substrate carriers that include the first docking features.

In a third aspect of the invention, a loadport is provided that is adapted to interact with a substrate carrier having first docking features. The loadport includes second docking features adapted to block docking of substrate carriers that do not include the first docking features and to allow docking of substrate carriers that include the first docking features.

In a fourth aspect of the invention, a method is provided that includes the steps of (1) determining what type of substrates are to be received at a processing tool; (2) providing substrate carriers, that are to be delivered to the processing tool, with first docking features; and (3) providing a loadport of the processing tool with second docking features adapted to block docking of substrate carriers that do not include the first docking features and to allow docking of substrate carriers that include the first docking features. Numerous other aspects are provided.

Other features and aspects of the present invention will become more fully apparent from the following detailed description, the appended claims and the accompanying drawings.

BRIEF DESCRIPTION OF THE DRAWINGS

FIGS. 3A-4B are perspective views of the substrate carrier of FIGS. 2A-C during a docking operation at a loadport in accordance with the present invention.

DETAILED DESCRIPTION

Figure 1B:
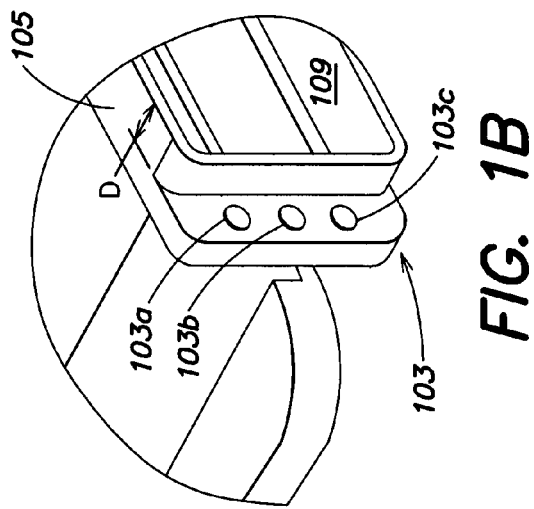
FIG. 1B is a close-up view of a first side of the substrate carrier of FIG. 1A.

As stated, it is desirable to open a substrate carrier at a processing location only if the substrate carrier contains substrates that will not contaminate the processing location. For example, if a substrate carrier that contains substrates with copper features is inadvertently transferred to a dedicated non-copper tool (such as lithography and other tools used for transistor formation), opening the carrier at the non-copper tool may contaminate the tool and all substrates subsequently processed at the tool.

In accordance with at least one embodiment of the present invention, a substrate carrier may be provided with various features (e.g., "docking" features) that prevent the substrate carrier from properly docking with a loadport of a processing tool (or otherwise opening at the processing tool) unless the substrate carrier is intended to be docked and/or opened at the loadport (or another location) of the processing tool.

In one or more embodiments of the invention, the substrate carrier and a loadport may have features (e.g., "docking" features) that "match" when the substrate carrier is intended to be opened at the loadport. If a substrate carrier does not have the matching features, the substrate carrier will be unable to dock (and open) at the loadport. Similar matching, docking features may be provided between (1) a door of a substrate carrier and a door opener of a loadport; (2) an overhead transfer flange of a substrate carrier and an overhead support of a loadport (or storage shelf); (3) an overhead transfer flange of a substrate carrier and a clamping mechanism of an overhead support adapted to securely hold the substrate carrier relative to the overhead support; and/or (4) any other suitable components of the substrate carrier and loadport. These and other embodiments of the invention are described below with reference to FIGS. 1A-9.

Furthermore, in one or more embodiments of the invention, the features that are used to allow or prevent docking and/or opening of a substrate carrier at a loadport do not prevent successful placement of the substrate carrier on a support mechanism of the loadport. Therefore, an automation system that delivers a substrate carrier to the loadport can successfully deliver the carrier regardless of the presence or absence of the features that allow the substrate carrier to be docked at the loadport. In this manner, a substrate carrier that is inadvertently delivered to the wrong tool can simply be unloaded by the automation system and re-delivered to the correct tool (otherwise, a substrate carrier that is inadvertently delivered to the wrong tool may require human operator intervention to remove the offending carrier and free the loadport and/or automation system).

Exemplary Delivery System for Substrate Carriers

Previously incorporated U.S. patent application Ser. No. 10/650,310, filed Aug. 28, 2003 and titled "System For Transporting Substrate Carriers", discloses a substrate carrier transport system or similar delivery system that includes a conveyor for substrate carriers that is intended to be constantly in motion during operation of the fabrication facility which it serves. The constantly moving conveyor is intended to facilitate transportation of substrates within the fabrication facility so as to reduce the total "dwell" time of each substrate in the fabrication facility.

To operate a fabrication facility in this manner, methods and apparatus should be provided for unloading substrate carriers from the conveyor, and for loading substrate carriers onto the conveyor, while the conveyor is in motion. Previously incorporated U.S. patent application Ser. No. 10/650, 480, filed Aug. 28, 2003 and titled "Substrate Carrier Handler That Unloads Substrate Carriers Directly From a Moving Conveyor", discloses a substrate carrier handler at a substrate loading station or "tool station" that may perform such loading/unloading operations with respect to a moving conveyor. For example, a substrate loading station or tool station may include a horizontal guide or crane that is moveable vertically, and an end effector that is moveable horizontally along the horizontal guide. Other configurations for moving the end effector vertically and/or horizontally are provided.

To unload a substrate carrier from a moving conveyor that transfers substrate carriers (a "substrate carrier conveyor") and that passes by the substrate loading station, the end effector is moved horizontally at a velocity that substantially matches the velocity of the substrate carrier as it is being transported by the substrate carrier conveyor (e.g., by substantially matching substrate carrier speed in a horizontal direction). In addition, the end effector may be maintained in a position adjacent the substrate carrier as the substrate carrier is being transported. The end effector thus may substantially match a position of the substrate carrier while substantially matching a velocity of the substrate carrier. Likewise, conveyor position and/or velocity may be substantially matched.

While the end effector substantially matches the substrate carrier's velocity (and/or position), the end effector is raised so that the end effector contacts the substrate carrier and disengages the substrate carrier from the substrate carrier conveyor. A substrate carrier similarly may be loaded onto the moving substrate carrier conveyor by substantially matching end effector and conveyor velocities (and/or positions) during loading. In at least one embodiment, such substrate carrier handoffs between the end effector and substrate carrier conveyor are performed at a substantially zero velocity and/or acceleration between the end effector and the substrate carrier.

Previously incorporated U.S. patent application Ser. No. 10/764,982, filed Jan. 26, 2004 and titled "Methods and Apparatus for Transporting Substrate Carriers", describes a conveyor system that may be employed with the above-described substrate carrier transport system and/or tool station for transporting substrate carriers between one or more processing tools of a semiconductor device manufacturing facility. The conveyor system may include a ribbon (or "band") that forms a closed loop within at least a portion of the semiconductor device manufacturing facility and that transports substrate carriers therein. In one or more embodiments, the ribbon or band may be formed from stainless steel, polycarbonate, composite materials (e.g., carbon graphite, fiberglass, etc.), steel or otherwise reinforced polyurethane, epoxy laminates, plastic or polymer materials that include stainless steel, fabric (e.g., carbon fiber, fiberglass, Kevlar® available from DuPont, polyethelene, steel mesh, etc.) or another stiffening material, etc. By orienting the ribbon so that a thick portion of the ribbon resides within a vertical plane and a thin portion of the ribbon resides within a horizontal plane, the ribbon is flexible in the horizontal plane and rigid in the vertical plane. Such a configuration allows the conveyor to be constructed and implemented inexpensively. For example, the ribbon requires little material to construct, is easy to fabricate and, due to its vertical rigidity/strength, can support the weight of numerous substrate carriers without supplemental support structure (such as rollers or other similar mechanisms used in conventional, horizontally-oriented belt-type conveyor systems). Furthermore, the conveyor system is highly customizable because the ribbon may be bent, bowed or otherwise shaped into numerous configurations due to its lateral flexibility.

Previously incorporated U.S. patent application Ser. No. 10/764,820, filed Jan. 26, 2004 and titled "OVERHEAD TRANSFER FLANGE AND SUPPORT FOR SUSPENDING A SUBSTRATE CARRIER" describes an overhead transfer flange for a substrate carrier and a corresponding overhead support for supporting the carrier via the overhead transfer flange. The substrate carrier may be a single substrate carrier adapted to store only one substrate or a multiple substrate carrier adapted to store a plurality of substrates (e.g., a small or large lot size substrate carrier as described further below). In one aspect, the overhead support is adapted such that the support provides a capture window (for capturing the overhead transfer flange) that varies from a wider window to a narrower window in a direction in which the overhead transfer flange can approach the support. In a second aspect the overhead transfer flange and overhead support are adapted such that when the overhead transfer flange is supported by the overhead support, the overhead transfer flange is prevented from moving relative to the overhead support in any direction except vertically. In a further aspect the overhead transfer flange and overhead support are adapted such that if a substrate carrier supported thereby is impacted in a direction opposite to the direction in which the carrier is traveling, the carrier's overhead transfer flange will decouple from the overhead support, allowing the carrier to fall.

As used herein, a "small lot" size substrate carrier refers to a substrate carrier that is adapted to hold significantly fewer substrates than a conventional "large lot" size substrate carrier which typically holds 13 or 25 substrates. As an example, in one embodiment, a small lot size substrate carrier is adapted to hold 5 or less substrates. Other small lot size substrate carriers may be employed (e.g., small lot size carriers that hold 1, 2, 3, 4, 5, 6, 7 or more substrates, but significantly less than that of a large lot size substrate carrier). For example, in one embodiment, each small lot size substrate carrier may hold too few substrates for human transport of substrates carriers to be viable within a semiconductor device manufacturing facility.

Exemplary Substrate Carrier and Loadport Features

Figure 1C:
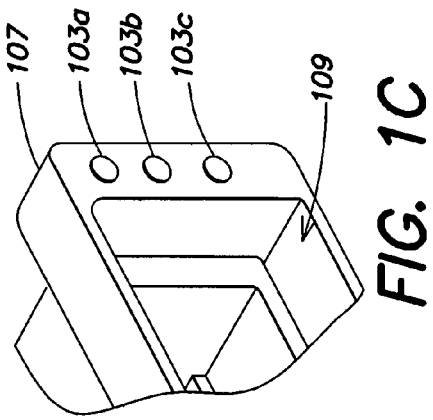
FIG. 1C is a close-up view of a second side of the substrate carrier of FIG. 1A.
Figure 1A:
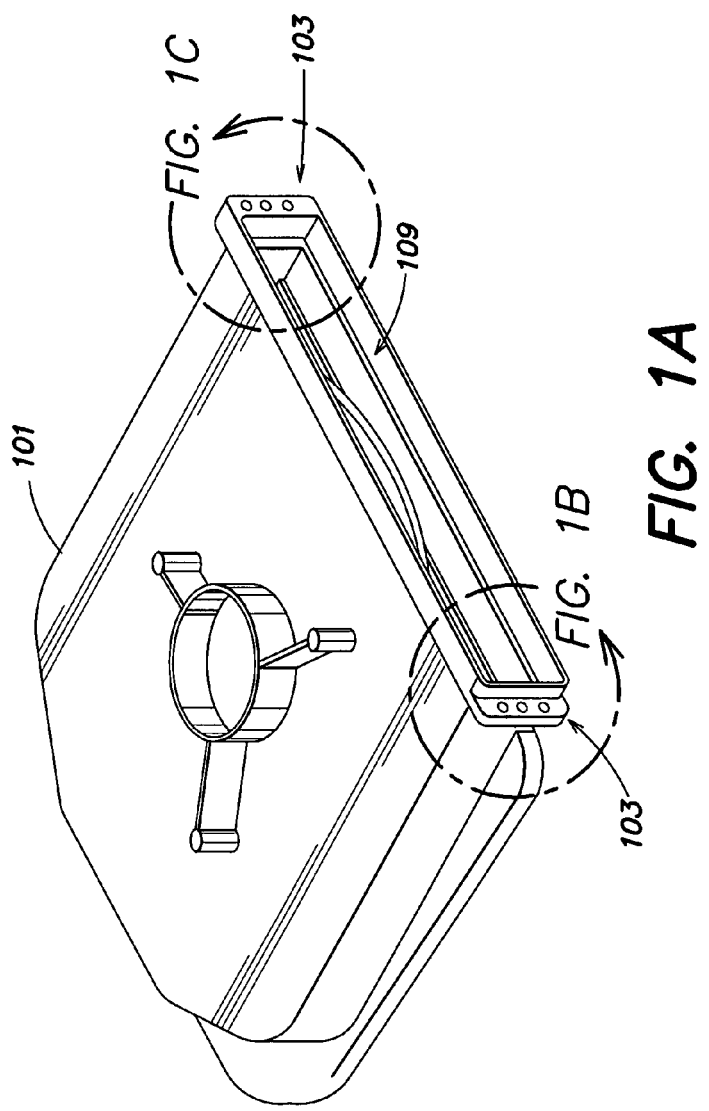
FIG. 1A is a perspective view of a first exemplary small lot size substrate carrier having first features for identifying the contents of the substrate carrier in accordance with the present invention.

FIG. 1A is a perspective view of a first exemplary small lot size substrate carrier 101 having first features 103 for identifying the contents of the substrate carrier 101 in accordance with the present invention. FIG. 1B is a close-up view of a first side 105 of the substrate carrier 101, and FIG. 1C is a close-up view of a second side 107 of the substrate carrier 101. In the embodiment of FIGS. 1A-C, the first features 103 include one or more holes. In the embodiment shown, three holes 103a-c are provided on each side of the substrate carrier 101. In other embodiments, other numbers of holes may be used (e.g., 1, 2, 4, 5, 6, etc.), and any hole shape may be employed (e.g., circular, oval, triangular, square, rectangular, tapered, etc.). Note that the first features 103 need not be present on both sides of the substrate carrier 101 and/or may be otherwise located (e.g., along a top and/or bottom of the carrier).

With reference to FIG. 1B, the holes 103a-c on the first side 105 of the substrate carrier 101 are offset from an opening 109 of the substrate carrier 101 (e.g., by a distance D). Such an offset may prevent particles generated during contact between the first features 103 and corresponding features of a load port (FIGS. 3A-4B) from entering the opening 109 of the substrate carrier 101. Such an offset may be eliminated, for example, as shown by the second side 107 of the substrate carrier 101 in which the first features 103 are coplanar with the opening 109 of the substrate carrier 101.

Figure 2B:
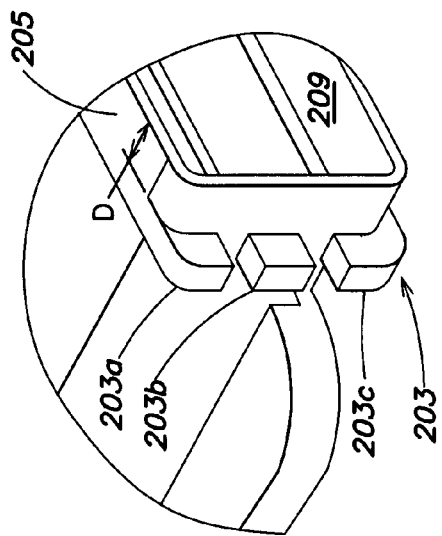
FIG. 2B is a close-up view of a first side of the substrate carrier of FIG. 2A.
Figure 2C:
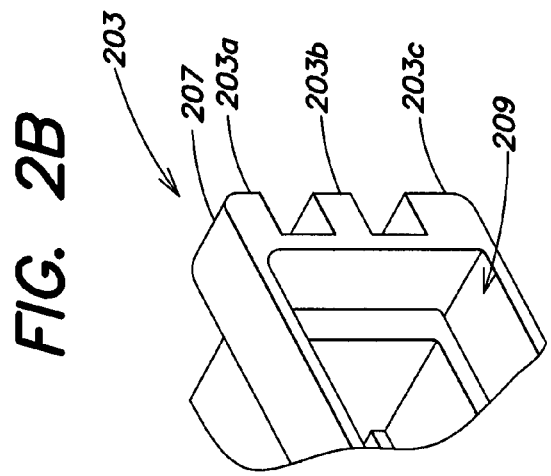
FIG. 2C is a close-up view of a second side of the substrate carrier of FIG. 2A.
Figure 2A:
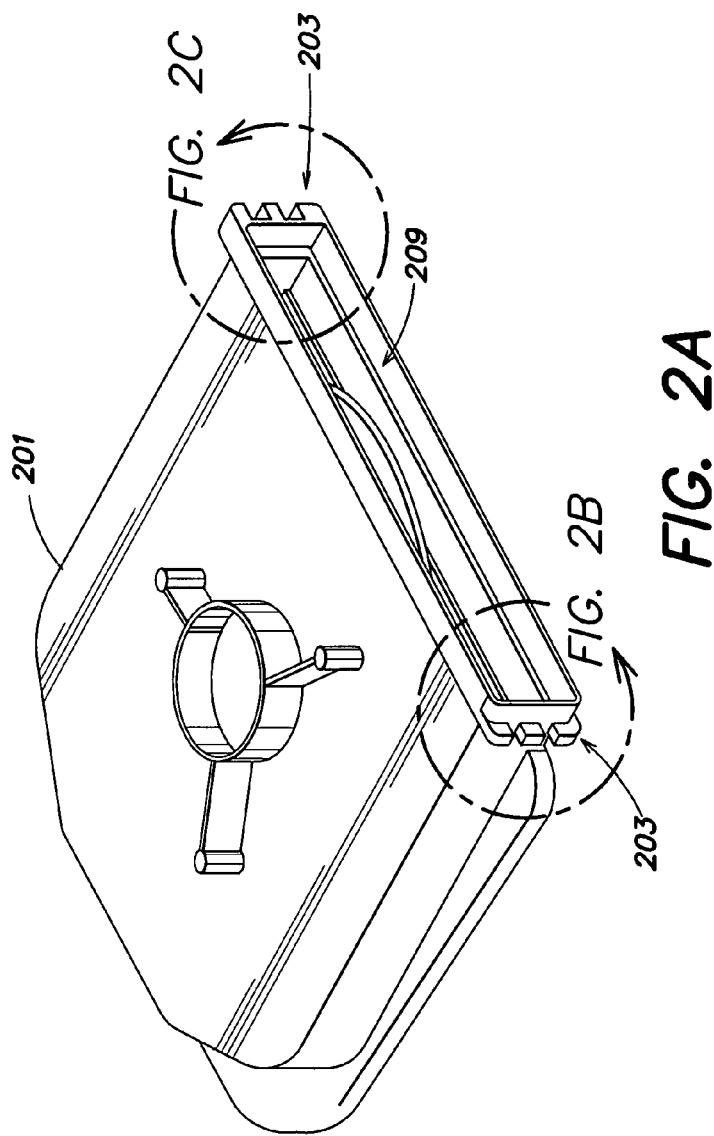
FIG. 2A is a perspective view of a second exemplary small lot size substrate carrier having first features for identifying the contents of the substrate carrier in accordance with the present invention.

FIG. 2A is a perspective view of a second exemplary small lot size substrate carrier 201 having first features 203 for identifying the contents of the substrate carrier 201 in accordance with the present invention. FIG. 2B is a close-up view of a first side 205 of the substrate carrier 201, and FIG. 2C is a close-up view of a second side 207 of the substrate carrier 201. In the embodiment of FIGS. 2A-C, the first features 203 include one or more teeth. In the embodiment shown, three teeth 203a-c are provided on each side of the substrate carrier 201, although other numbers of teeth may be used (e.g., 1, 2, 4, 5, 6, etc.). Any tooth shape may be employed (e.g., circular, oval, triangular, square, rectangular, tapered, etc.). Note that the first features 203 need not be present on both sides of the substrate carrier 201 and/or may be otherwise located (e.g., along a top and/or bottom of the carrier). Other features may be used.

With reference to FIG. 2B, the teeth 203a-c on the first side 205 of the substrate carrier 201 are offset from an opening 209 of the substrate carrier 201 (e.g., by a distance D). Such an offset may prevent particles generated during contact between the first features 203 and corresponding features of a load port (FIGS. 3A-4B) from entering the opening 209 of the substrate carrier 201. Such an offset may be eliminated, for example, as shown by the second side 207 of the substrate carrier 201 in which the first features 203 are coplanar with the opening 209 of the substrate carrier 201.

The first features 103, 203 of FIGS. 1A-C and 2A-C are particularly useful when the substrate carrier 101 and/or 201 is held by an overhead mounting mechanism such as that described in U.S. patent application Ser. No. 10/764,820, filed Jan. 26, 2004 and titled "OVERHEAD TRANSFER FLANGE AND SUPPORT FOR SUSPENDING A SUBSTRATE CARRIER" (e.g., an overhead transfer flange for a substrate carrier and a corresponding overhead support for supporting the carrier via the overhead transfer flange). The features 103, 203 are particularly useful because their absence only prevents substrate carriers from being docked or opened by the loadport, and does not prevent an automation system from successfully delivering substrate carriers to or removing substrate carriers from the loadport. Therefore, the automation system can automatically recover a substrate carrier without human operator intervention when the substrate carrier is inadvertently delivered to the wrong processing tool. The first features 103, 203 may be employed with other carrier types and/or sizes (e.g., small or large lot size substrate carriers).

FIG. 3A-4B are perspective views of the substrate carrier 201 of FIGS. 2A-C during a docking operation at a loadport 301 in accordance with the present invention. Such a docking operation may be used, for example, to open a door of the substrate carrier 201 (to allow extraction of one or more substrates from the opening 209 of the substrate carrier 201). A similar docking operation may be used with the substrate carrier 101 of FIGS. 1A-C.

Figure 4B:
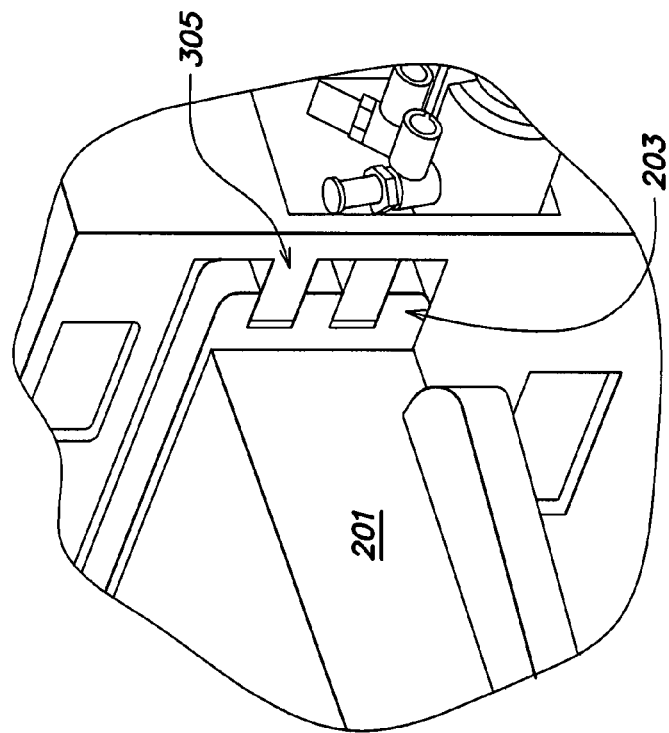
Figure 3B:
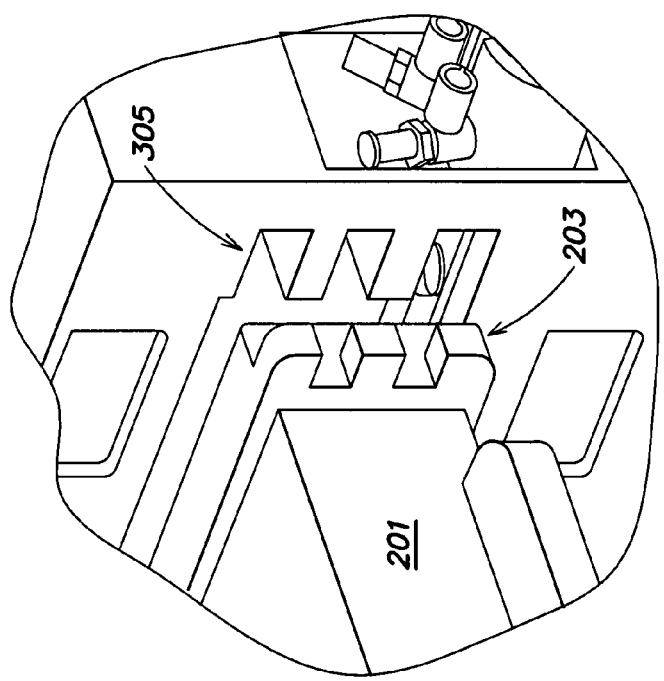

With reference to FIG. 3A, the substrate carrier 201 is aligned with the loadport 301. For example, an overhead transfer flange 303 may be employed to suspend the substrate carrier 201 in front of the loadport 301 via an overhead support (not shown). Other supporting mechanisms may be employed. As shown in FIG. 3B, the loadport 301 includes second features 305 that allow the first features 203 of the substrate carrier 201 to pass by and/or through the second features 305. For example, a carrier opening mechanism of the loadport 301 may include the second features 305. In this manner, the substrate carrier 201 may be docked and/or opened at the loadport 301 as shown in FIGS. 4A-4B. Note that if the first features 203 of the carrier 201 do not "match" the second features 305 of the loadport 301, then the substrate carrier 201 will be unable to dock at the loadport 301 (due to interference between the first and second features 203, 305 during docking). Accordingly, the substrate carrier 201 can not be opened at the loadport 301. In this manner, only substrate carriers that contain features that match a loadport's features (e.g., features of a carrier opening mechanism of the loadport) may be docked and/or opened at the loadport. Information regarding the contents of the substrate carrier 201 thereby is communicated by the first features 203 and/or by the interaction between the first features 203 and the second features 305. Other loadport features may be employed.

The foregoing description discloses only exemplary embodiments of the invention. Modifications of the above disclosed apparatus and methods which fall within the scope of the invention will be readily apparent to those of ordinary skill in the art. For instance, the first features 103, 203 may be coupled to or integral with the carriers 101, 201. Likewise, the second features 305 may be coupled to or integral with the loadport 301. Features of the substrate carrier 101, 201 and/or loadport 301 may be permanent (static) or configurable. For example, having all the holes 103a-c of the substrate carrier 101 opened may identify that a first substrate type is present in the substrate carrier 101. Having one or more of the holes 103a-c covered or otherwise closed may identify that a second substrate type is present in the substrate carrier 101. Likewise, having all of the teeth 203a-c of the substrate carrier 201 present may identify that a first substrate type is present in the substrate carrier 201, while having one or more of the teeth 203a-c removed may identify that a second substrate type is present in the substrate carrier 201. The second features 305 of the loadport 301 also may be employed to kinematically align a substrate carrier to the carrier opening mechanism of the loadport. Further, the overhead flange 303 and the support (not shown) that holds the overhead flange 303 may include similar features. In this manner, only a substrate carrier having an overhead flange with features that match the features of a support of a loadport may be supported near the loadport.

Figure 5:
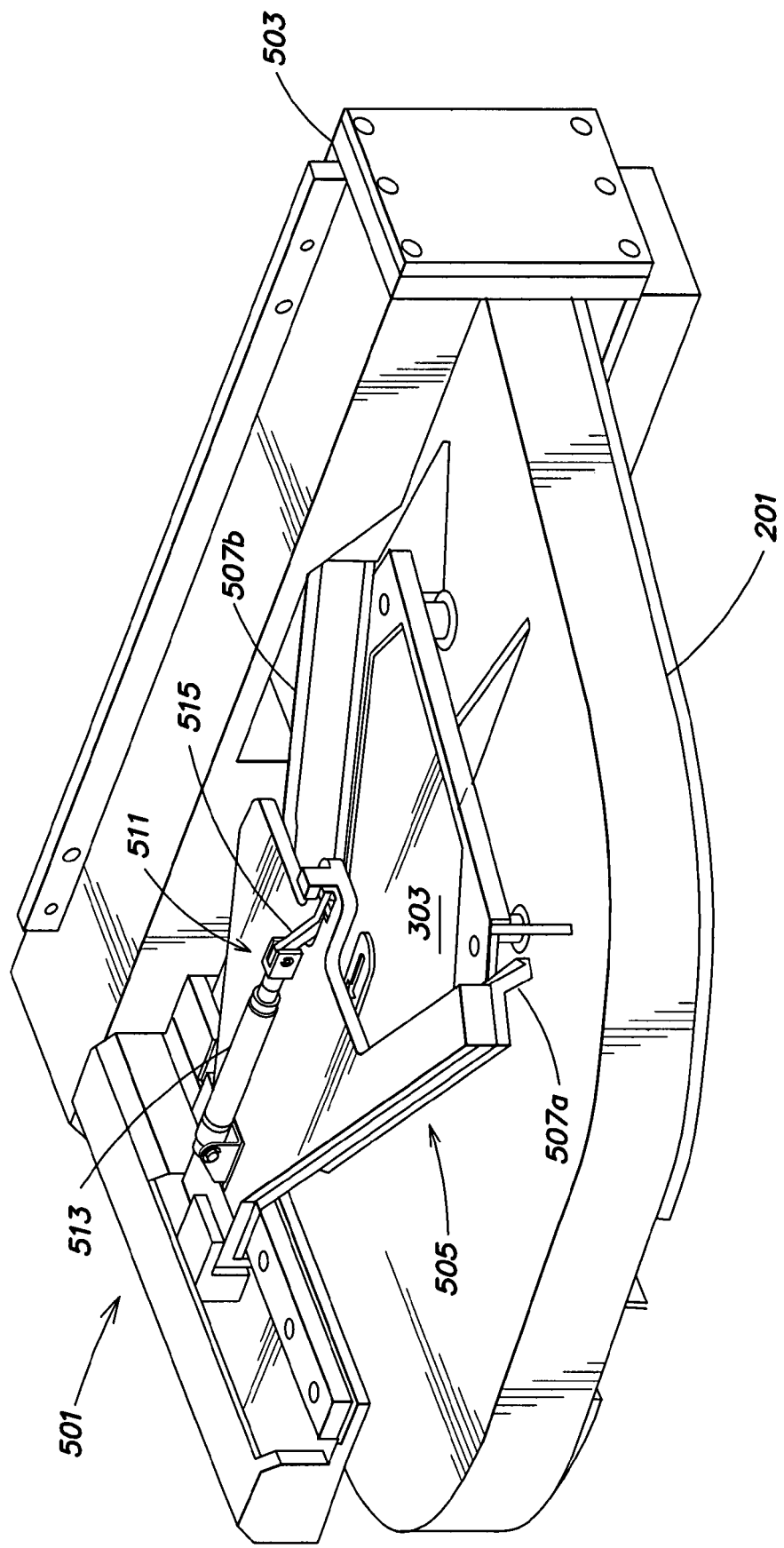
FIG. 5 illustrates an exemplary substrate carrier support and docking mechanism that may be employed at a loadport in accordance with the present invention.
Figure 6:
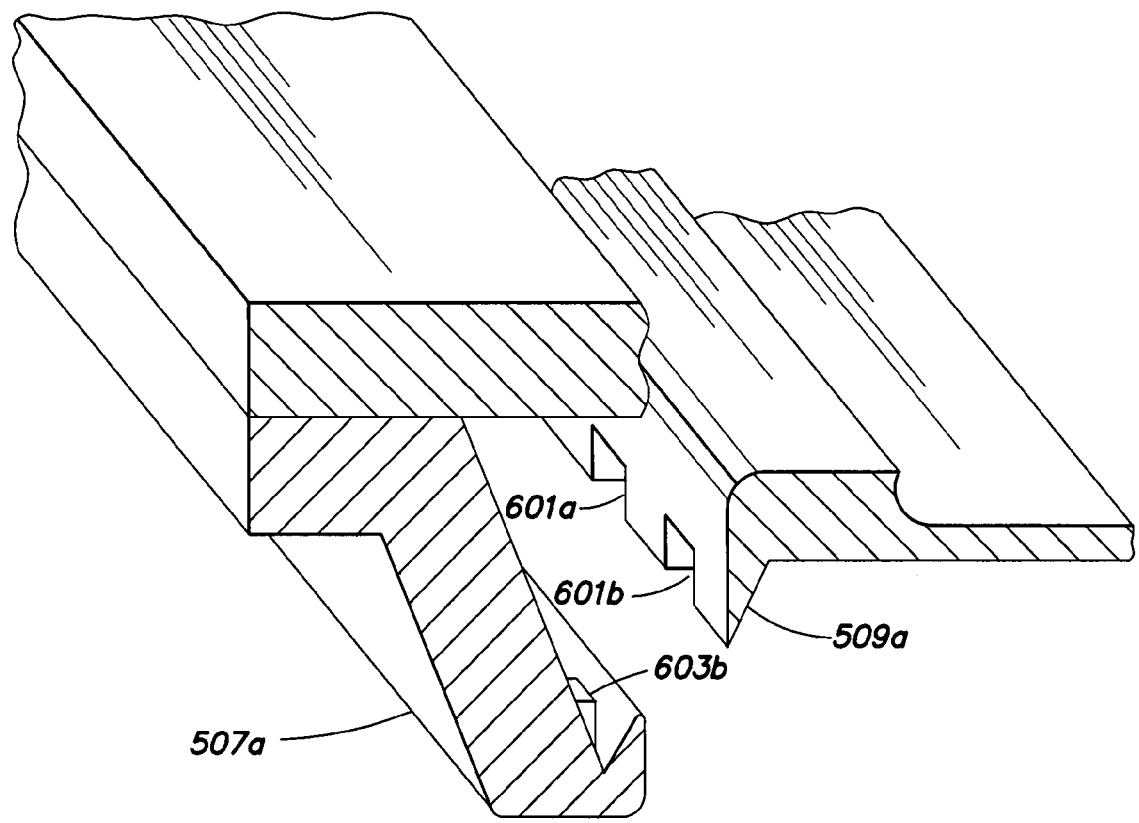
FIG. 6 is a close-up, perspective view of a portion of the blades of the overhead transfer flange and overhead support of FIG. 5 that illustrate how the blades may interface with each other in accordance with the present invention.

FIG. 5 illustrates an exemplary substrate carrier support and docking mechanism 501 that may be employed at a loadport 503 of a processing tool (not shown) in accordance with the present invention. With reference to FIG. 5, the support and docking mechanism 501 includes a overhead support member 505 having blades 507a, 507b adapted to interface with and support the overhead transfer flange 303 of the substrate carrier 201 as shown. FIG. 6 is a close-up, perspective view of a portion of the blade 507a of the overhead support 505 and a first blade 509a of the overhead transfer flange 303 that illustrates how the blades 507a, 509a may interface with each other.

Figure 7:
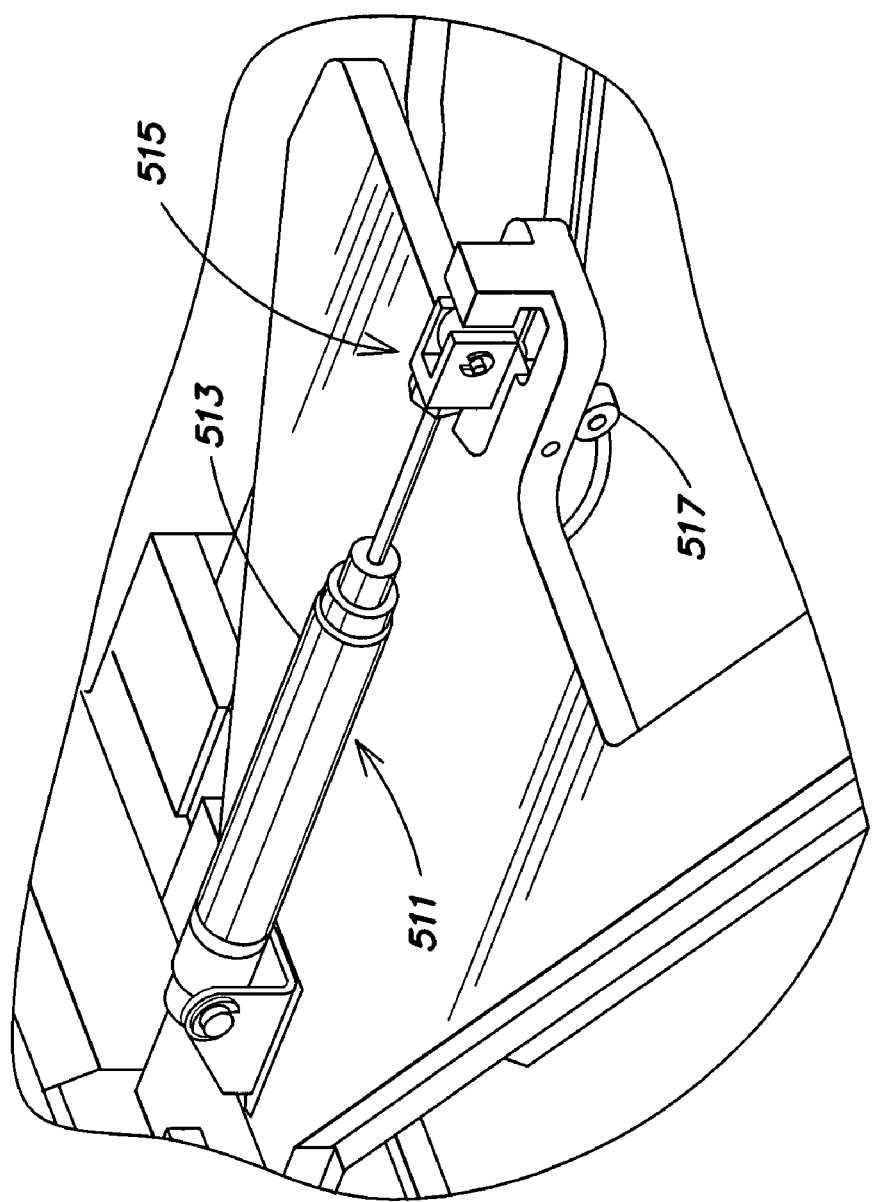
FIG. 7 is a close-up, perspective view of a portion of the clamping mechanism of FIG. 5.

FIG. 5 also illustrates a clamping mechanism 511 that may be employed to secure the substrate carrier 201 (or any other substrate carrier described herein) relative to the blades 507a, 507b of the overhead support 505 during storage, docking, undocking, etc. of the substrate carrier 201. FIG. 7 is a close-up, perspective view of a portion of the clamping mechanism 511. As shown in FIGS. 5 and 7, the clamping mechanism 511 includes an actuating mechanism 513 (e.g., a linear actuator such as a pneumatic actuator) coupled to a pivot member 515. The pivot member 515 includes a contact member 517 (e.g., one or more wheels) adapted to contact the overhead transfer flange 303 of the substrate carrier 201 so as to prevent the flange 303 from disengaging with the blades 507a, 507b.

In operation, the actuating member 513 is retracted so that the contact member 517 will not interfere with the substrate carrier 201 when it is loaded onto the blades 507a, 507b. The overhead transfer flange 303 of the substrate carrier 201 then is loaded onto and supported by the blades 507a, 507b. The actuating mechanism 513 then is extended so as to pivot the pivot member 515, placing the contact member 517 in contact with the overhead transfer flange 303 of the substrate carrier 201. The substrate carrier 201 thus is securely held relative to the blades 507a, 507b (e.g., during any docking or undocking movements, or simply during storage of the substrate carrier 201). To remove the substrate carrier 201, the actuating member 513 is retracted so that the contact member 517 no longer contacts the overhead transfer flange 303.

In accordance with at least one embodiment of the invention, one or more of the blades 509a, 509b of the overhead transfer flange 303 of the substrate carrier 201 may include first features 601a, 601b (FIG. 6) and one or more of the blades 507a, 507b of the support member 505 may include second features 603a, 603b. The first and second features 601a-b, 603a-b align only when the substrate carrier 201 is a carrier suitable for docking at the loadport 503. In this embodiment, non-matching first and second features may prevent successful placement of a substrate carrier by an automation system on the support blades of the support member. Alternatively, the clamping mechanism 511 may include features that only allow the substrate carrier 201 to be clamped at the loadport 503 if the substrate carrier 201 is suitable for docking at the loadport 503. For example, the overhead transfer flange 303 may include first features (not shown) adapted to align with second features (not shown) of the contact member 517 (if the substrate carrier 201 is intended to be docked at the loadport 503). In this embodiment, non-matching first and second features allow successful placement of a substrate carrier by an automation system, and only prevent the substrate carrier from being successfully clamped after placement (e.g., and unable to dock at the loadport).

Figure 8:
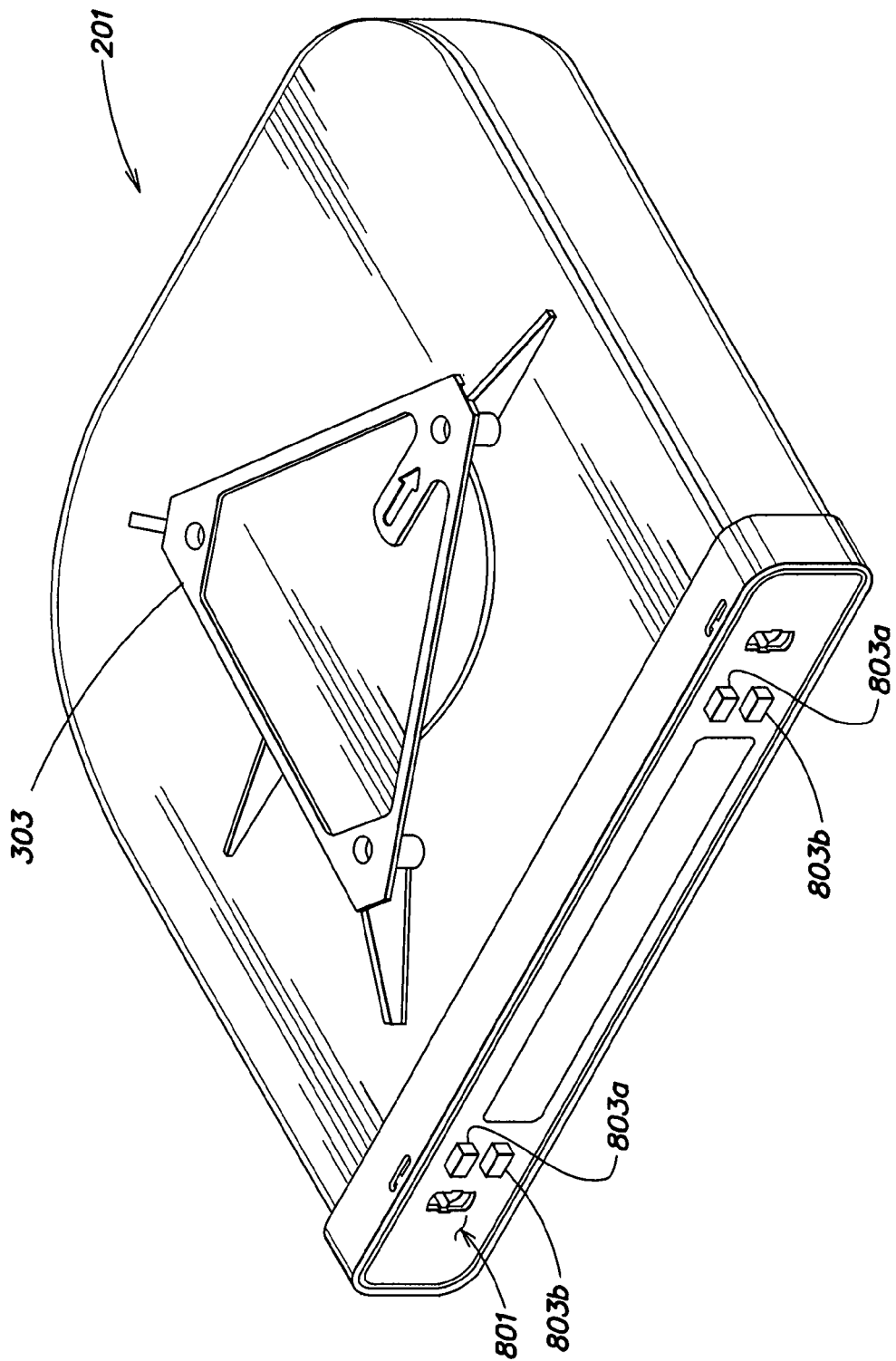
FIG. 8 is a perspective view of an exemplary embodiment of the substrate carrier of FIGS. 2A-2C showing a door of the carrier in accordance with the present invention.
Figure 9:
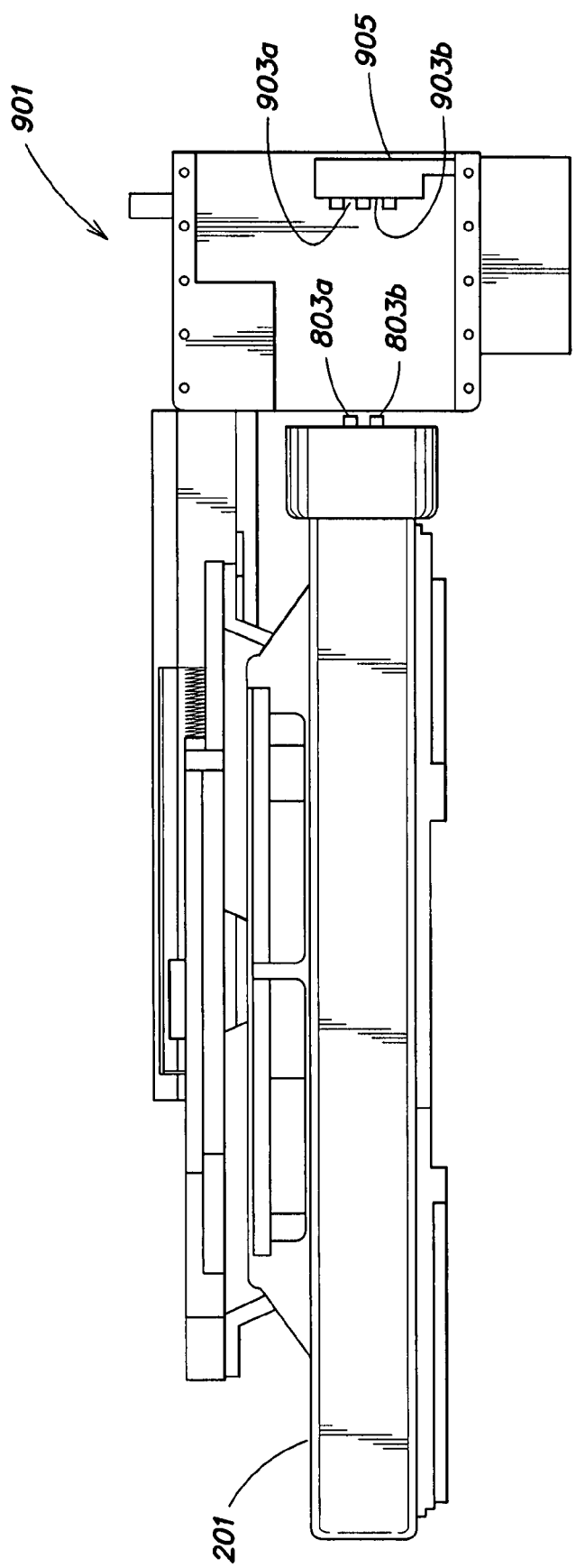
FIG. 9 is a side view of an exemplary load port adapted to open the door of the carrier of FIG. 8 during a docking operation in accordance with the present invention.

FIG. 8 is a perspective view of the substrate carrier 201 showing a door 801 of the carrier 201 provided in accordance with the present invention; and FIG. 9 is a side view of a loadport 901 adapted to open the door 801 of the carrier 201 during a docking operation provided in accordance with the present invention. In at least one embodiment of the invention, the door 801 may include first features 803a-b that are adapted to align with second features 903a-b of a door opening mechanism 905 only when the substrate carrier 201 is a carrier suitable for docking at the loadport 901. The features 803a-b, 903a-b may be attached to or integral with the door 801, door opening mechanism 905. The door opening mechanism 905 may be adapted to hold and/or unlatch the door 801 so as to open the substrate carrier 201 as described, for example, in previously incorporated U.S. patent application Ser. No. 11/051,504, filed Feb. 4, 2005 and titled "SMALL LOT SIZE SUBSTRATE CARRIERS". Other numbers of first and/or second features may be used in any of the embodiments described herein, as may other shapes and/or sizes.

The present invention may be employed with large or small lot size substrate carriers. Any of the features described herein may be permanent or configurable.

Accordingly, while the present invention has been disclosed in connection with exemplary embodiments thereof, it should be understood that other embodiments may fall within the spirit and scope of the invention, as defined by the following claims.

The invention claimed is:

1. A system comprising:
   a substrate carrier having first docking features and adapted to be opened by opening a door; and
   a loadport having second docking features and a carrier opening mechanism;
   wherein the carrier opening mechanism matches with the door, and the carrier opening mechanism is capable of opening the door after docking of the substrate carrier with the loadport is completed;
   wherein the first docking features are adapted to interact with the second docking features;
   wherein an interaction of the first and second docking features is adapted to:
      allow docking of the substrate carrier by allowing the first docking features to pass by or through the second docking features if the first docking features match with the second docking features; and
      block docking of the substrate carrier by not allowing the first docking features to pass by or through the second docking features if the first docking features do not match with the second docking features wherein the substrate carrier includes geometry which would otherwise allow docking at the loadport except for the mismatch of the first docking features and the second docking features;
   wherein docking occurs after a placement of the substrate carrier at the loadport; and
   wherein docking does not comprise the placement of the substrate carrier at the loadport or the opening of the door.

2. The system of claim 1 wherein the first docking features comprise a plurality of holes.

3. The system of claim 1 wherein the first docking features comprise a plurality of teeth.

4. The system of claim 1 wherein the first docking features are located on at least one side of the substrate carrier.

5. The system of claim 4 wherein at least one of the first docking features is aligned with an opening of the substrate carrier.

6. The system of claim 4 wherein at least one of the first docking features is offset away from an opening of the substrate carrier.

7. The system of claim 1 wherein the first docking features are located on the door of the substrate carrier.

8. The system of claim 1 wherein the first docking features are located on an overhead transfer flange of the substrate carrier.

9. The system of claim 1 wherein the first docking features are integrally formed with the substrate carrier.

10. The system of claim 1 wherein the substrate carrier is a small lot size substrate carrier adapted to house fewer than thirteen substrates.

11. The system of claim 1 wherein the second docking features are located near a door opening mechanism of the loadport.

12. The system of claim 1 wherein the second docking features are located on a door opening mechanism of the loadport.

13. The system of claim 1 wherein the second docking features are integrally formed with the loadport.

14. The system of claim 1 wherein at least one of the first and second docking features is adapted to be configured to one of a plurality of configurations.

15. The system of claim 1 wherein the first docking features identify a content of the substrate carrier.

16. A substrate carrier comprising:
   first docking features adapted to interact with second docking features of a loadport, the loadport further comprising a carrier opening mechanism;
   wherein the substrate carrier is adapted to be opened by opening a door;
   wherein the carrier opening mechanism matches with the door, and the carrier opening mechanism is capable of opening the door after docking of the substrate carrier with the loadport is completed;
   wherein an interaction of the first and second docking features is adapted to:
      allow docking of the substrate carrier if the first docking features match with the second docking features by allowing the first docking features to pass by or through the second docking features; and
      block docking of the substrate carrier by not allowing the first docking features to pass by or through the second docking features if the first docking features do not match with the second docking features wherein the substrate carrier includes geometry which would otherwise allow docking at the loadport except for the mismatch of the first docking features and the second docking features;
   wherein docking occurs after a placement of the substrate carrier at the loadport; and
   wherein docking does not comprise the placement of the substrate carrier at the loadport or the opening the door.

17. The substrate carrier of claim 16 wherein the first docking features comprise a plurality of holes.

18. The substrate carrier of claim 16 wherein the first docking features comprise a plurality of teeth.

19. The substrate carrier of claim 16 wherein the first docking features are located on at least one side of the substrate carrier.

20. The substrate carrier of claim 19 wherein at least one of the first docking features is aligned with an opening of the substrate carrier.

21. The substrate carrier of claim 19 wherein at least one of the first docking features is offset away from an opening of the substrate carrier.

22. The substrate carrier of claim 16 wherein the first docking features are located on the door of the substrate carrier.

23. The substrate carrier of claim 16 wherein the first docking features are located on an overhead transfer flange of the substrate carrier.

24. The substrate carrier of claim 16 wherein the first docking features are integrally formed with the substrate carrier.

25. The substrate carrier of claim 16 wherein the first docking features are adapted to be configured to one of a plurality of configurations.

26. A loadport adapted to interact with a substrate carrier having first docking features and adapted to be opened by opening a door, the loadport comprising:
   second docking features, and
   a carrier opening mechanism;
   wherein the carrier opening mechanism matches with the door, and the carrier opening mechanism is capable of opening the door after docking of the substrate carrier with the loadport is completed;

wherein an interaction of the first and second docking features is adapted to:

allow docking of the substrate carrier if the first docking features match with the second docking features by allowing the first docking features to pass by or through the second docking features; and block docking of the substrate carrier by not allowing the first docking features to pass by or through the second docking features if the first docking features do not match with the second docking features wherein the substrate carrier includes geometry which would otherwise allow docking at the loadport except for the mismatch of the first docking features and the second docking features;

wherein docking occurs after a placement of the substrate carrier at the loadport; and wherein docking does not comprise the placement of the substrate carrier at the loadport or the opening the door.

27. The loadport of claim 26 wherein the second docking features are located near a door opening mechanism of the loadport.

28. The loadport of claim 26 wherein the second docking features are located on a door opening mechanism of the loadport.

29. The loadport of claim 26 wherein the second docking features are integrally formed with the loadport.

30. The loadport of claim 26 wherein the second docking features are adapted to be configured to one of a plurality of configurations.

31. A method comprising:

matching a type of substrates to be received at a processing tool with second docking features;

providing a substrate carrier, to be delivered to the processing tool, with first docking features, the substrate carrier adapted to be opened by opening a door; and providing a loadport of the processing tool with the second docking features;

wherein the loadport further comprises a carrier opening mechanism;

wherein the carrier opening mechanism matches with the door, and the carrier opening mechanism is capable of opening the door after docking of the substrate carrier with the loadport is completed;

wherein the first docking features are adapted to interact with the second docking features;

wherein an interaction of the first and second docking features is adapted to:

allow docking of the substrate carrier by allowing the first docking features to pass by or through the second docking features if the first docking features match with the second docking features; and block docking of the substrate carrier by not allowing the first docking features to pass by or through the second docking features if the first docking features do not match with the second docking features wherein the substrate carrier includes geometry which would otherwise allow docking at the loadport except for the mismatch of the first docking features and the second docking features;

wherein docking occurs after a placement of the substrate carrier at the loadport; and wherein docking does not comprise the placement of the substrate carrier at the loadport or the opening the door.

32. The method of claim 31 further comprising:
receiving the substrate carrier at the loadport; and
blocking docking of the substrate carrier if the first docking features do not match with the second docking features.

33. The method of claim 31 further comprising:
receiving the substrate carrier at the loadport; and
allowing docking of the substrate carrier if the first docking features match with the second docking features.

* * * * *